US010475661B2

(12) United States Patent
Seo et al.

(10) Patent No.: US 10,475,661 B2
(45) Date of Patent: Nov. 12, 2019

(54) SEMICONDUCTOR DEVICE INCLUDING A CAPACITOR STRUCTURE AND METHOD FOR MANUFACTURING THE SAME

(71) Applicant: SAMSUNG ELECTRONICS CO., LTD., Suwon-si, Gyeonggi-do (KR)

(72) Inventors: Youngsik Seo, Hwaseong-si (KR); Sungil Cho, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/021,100

(22) Filed: Jun. 28, 2018

(65) Prior Publication Data
US 2019/0088491 A1    Mar. 21, 2019

(30) Foreign Application Priority Data
Sep. 18, 2017 (KR) .......................... 10-2017-0119705

(51) Int. Cl.
*H01L 21/308* (2006.01)
*H01L 27/108* (2006.01)
(Continued)

(52) U.S. Cl.
CPC ...... *H01L 21/3086* (2013.01); *H01L 21/0228* (2013.01); *H01L 21/02057* (2013.01);
(Continued)

(58) Field of Classification Search
None
See application file for complete search history.

(56) References Cited

U.S. PATENT DOCUMENTS 5,445,710 A * 8/1995 Hori .................... H01L 21/0332
438/717
5,578,166 A * 11/1996 Hirota ............... H01L 21/32136
216/67
(Continued)

FOREIGN PATENT DOCUMENTS

JP     2008198713    8/2008
KR    1020070031503  3/2007
(Continued)

*Primary Examiner* — Allan W. Olsen
(74) *Attorney, Agent, or Firm* — F. Chau & Associates, LLC

(57) ABSTRACT

A method for manufacturing a semiconductor device includes providing a substrate structure. The method includes forming a lower sacrificial layer, a lower supporter layer, an upper sacrificial layer, and an upper supporter layer which are sequentially stacked on the substrate structure. The method includes forming a mask pattern on the upper supporter layer; forming an upper supporter pattern by etching the upper supporter layer using the mask pattern as an etch mask. The method includes forming a recess region penetrating the upper supporter pattern, the upper sacrificial layer, the lower supporter layer, and the lower sacrificial layer, and removing the lower sacrificial layer and the upper sacrificial layer. The mask pattern is removed during the process of forming the upper supporter pattern. And, when the process of forming the recess region ends, the upper supporter pattern remains.

20 Claims, 12 Drawing Sheets

(51) Int. Cl.
  *H01L 21/02* (2006.01)
  *H01L 21/762* (2006.01)
  *H01L 29/66* (2006.01)
  *H01L 21/311* (2006.01)

(52) U.S. Cl.
  CPC .. *H01L 21/31122* (2013.01); *H01L 21/31138* (2013.01); *H01L 21/31144* (2013.01); *H01L 21/762* (2013.01); *H01L 27/1087* (2013.01); *H01L 29/66181* (2013.01)

(56) References Cited

U.S. PATENT DOCUMENTS

| | | | |
|---|---|---|---|
| 6,080,529 A * | 6/2000 | Ye | H01L 21/0274 430/318 |
| 6,242,358 B1 * | 6/2001 | Chu | H01L 21/32139 438/706 |
| 7,226,867 B2 * | 6/2007 | Son | C23F 4/00 257/E21.311 |
| 8,802,573 B2 * | 8/2014 | Subramanian | H01L 21/3065 438/719 |
| 8,846,540 B2 | 9/2014 | Lee et al. | |
| 8,940,643 B2 | 1/2015 | Ko et al. | |
| 9,012,326 B2 | 4/2015 | Kim et al. | |
| 9,323,155 B2 | 4/2016 | Chen et al. | |
| 9,496,266 B2 * | 11/2016 | Kim | H01L 27/10814 |
| 9,553,141 B2 * | 1/2017 | Yang | H01L 27/10852 |
| 9,647,056 B2 * | 5/2017 | Yoon | H01L 28/40 |
| 9,917,147 B2 * | 3/2018 | Lee | H01L 28/90 |
| 10,121,793 B2 * | 11/2018 | Kim | H01L 27/10814 |
| 10,170,541 B2 * | 1/2019 | Yi | H01L 27/10808 |
| 2006/0033137 A1 * | 2/2006 | Lee | H01L 27/10852 257/296 |
| 2008/0038673 A1 * | 2/2008 | Nagaiwa | H01L 21/31116 430/313 |
| 2012/0034419 A1 * | 2/2012 | Washburn | H01L 21/0332 428/138 |
| 2012/0040528 A1 * | 2/2012 | Kim | H01L 21/76816 438/675 |
| 2012/0098092 A1 * | 4/2012 | Park | H01L 23/5222 257/532 |
| 2012/0193761 A1 * | 8/2012 | Park | H01L 27/10852 257/532 |
| 2013/0147048 A1 * | 6/2013 | Kuh | H01L 23/49827 257/768 |
| 2013/0249053 A1 * | 9/2013 | Lee | H01L 28/40 257/532 |
| 2015/0079757 A1 | 3/2015 | Jeon et al. | |
| 2015/0236084 A1 * | 8/2015 | Park | H01L 27/10852 438/396 |
| 2016/0035730 A1 | 2/2016 | Sukekawa et al. | |
| 2016/0064194 A1 * | 3/2016 | Tokashiki | H01J 37/32091 156/345.28 |
| 2016/0064277 A1 * | 3/2016 | Park | H01L 27/10817 438/386 |
| 2016/0104618 A1 * | 4/2016 | Hong | H01L 21/31116 438/396 |
| 2016/0343799 A1 * | 11/2016 | Yi | H01L 28/91 |
| 2016/0379985 A1 * | 12/2016 | Choi | H01L 21/31116 438/396 |
| 2017/0309497 A1 * | 10/2017 | Dieny | H01L 45/06 |
| 2018/0026040 A1 * | 1/2018 | Hong | H01L 21/283 438/386 |
| 2018/0158827 A1 * | 6/2018 | You | H01L 27/10852 |
| 2018/0166449 A1 * | 6/2018 | Pak | H01L 27/10852 |

FOREIGN PATENT DOCUMENTS

| | | |
|---|---|---|
| KR | 1020110108548 | 10/2011 |
| KR | 1020140026086 | 3/2014 |
| KR | 1020150031672 | 3/2015 |
| KR | 101658492 | 9/2016 |

* cited by examiner

SEMICONDUCTOR DEVICE INCLUDING A CAPACITOR STRUCTURE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2017-0119705, filed on Sep. 18, 2017, in the Korean Intellectual Property Office, the disclosure of which is incorporated by reference herein in its entirety.

Technical Field

Exemplary embodiments of the present inventive concept relate to a semiconductor device including a capacitor structure, and more particularly to a method for manufacturing the same.

Discussion of Related Art

Semiconductor devices may be used in an electronics industry because of their relatively small sizes, multi-functional characteristics, and/or relatively low manufacture costs. Semiconductor devices may be categorized as semiconductor memory devices storing logical data, semiconductor logic devices processing logical data, and hybrid semiconductor devices having both the function of the semiconductor memory devices and the function of the semiconductor logic devices.

Relatively high-speed and low-voltage (e.g., relatively lower power consumption) semiconductor devices may be included in electronic devices. Semiconductor devices may be relatively highly integrated. Reliability of semiconductor devices may be reduced in relatively highly integrated semiconductor devices. However, high-reliable semiconductor devices have been increasingly demanded with the development of the electronics industry.

SUMMARY

An exemplary embodiment of the present inventive concept provides a semiconductor device with increased electrical stability.

An exemplary embodiment of the present inventive concept provides a method for manufacturing a semiconductor device, which is capable of reducing a process time and a process cost.

An exemplary embodiment of the present inventive concept provides a method for manufacturing a semiconductor device, which is capable of increasing structural stability.

According to exemplary embodiment of the present invention concept, a method for manufacturing a semiconductor device includes providing a substrate structure. The method includes forming a lower sacrificial layer, a lower supporter layer, an upper sacrificial layer, and an upper supporter layer which are sequentially stacked on the substrate structure. The method includes forming a mask pattern on the upper supporter layer; forming an upper supporter pattern by etching the upper supporter layer using the mask pattern as an etch mask. The method includes forming a recess region penetrating the upper supporter pattern, the upper sacrificial layer, the lower supporter layer, and the lower sacrificial layer, and removing the lower sacrificial layer and the upper sacrificial layer. The mask pattern is removed during the process of forming the upper supporter pattern. And, when the process of forming the recess region is end, the upper supporter pattern remains.

According to exemplary embodiment of the present invention concept, a method for manufacturing a semiconductor device includes providing a substrate structure, forming a sacrificial layer and a supporter layer stacked sequentially on the substrate structure. The method includes forming a mask pattern on the supporter layer, and forming a supporter pattern by etching the supporter layer using the mask pattern as an etch mask. The method includes forming the sacrificial pattern by etching the sacrificial layer using the supporter pattern as an etch mask, and removing the sacrificial pattern. The mask pattern is removed during the process of forming the supporter pattern, and when the process of forming the sacrificial pattern is end, the supporter pattern remains.

According to exemplary embodiment of the present invention concept, a method for manufacturing a semiconductor device includes forming a first sacrificial layer, a first supporter layer, a second sacrificial layer and a plurality of second supporter patterns above a substrate. The method includes etching the first sacrificial layer, the first supporter layer and the second sacrificial layer by using the plurality of second supporter patterns as a mask to form a plurality of first sacrificial patterns, a plurality of first supporter patterns and a plurality of second sacrificial patterns, wherein a thickness of each of the second supporter patterns is reduced by the etching, and wherein the etching forms a plurality of recess regions between the plurality of first sacrificial patterns, the plurality of first supporter patterns, the plurality of second sacrificial patterns and the plurality of second supporter patterns. The method includes forming a capacitor in each of the recess regions of the plurality of recess regions, wherein the capacitor includes a first conductive pattern, a dielectric pattern on the first conductive pattern and a second conductive pattern on the dielectric pattern, and wherein at least two second supporter patterns of the plurality of second supporter patterns are positioned to support the capacitor formed in each of the recess regions. And the method includes removing the plurality of first sacrificial patterns and the plurality of second sacrificial patterns.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

FIGS. 1 to 11 are cross-sectional views illustrating a method for manufacturing a semiconductor device, according to an exemplary embodiment of the present inventive concept.

Figure 1:
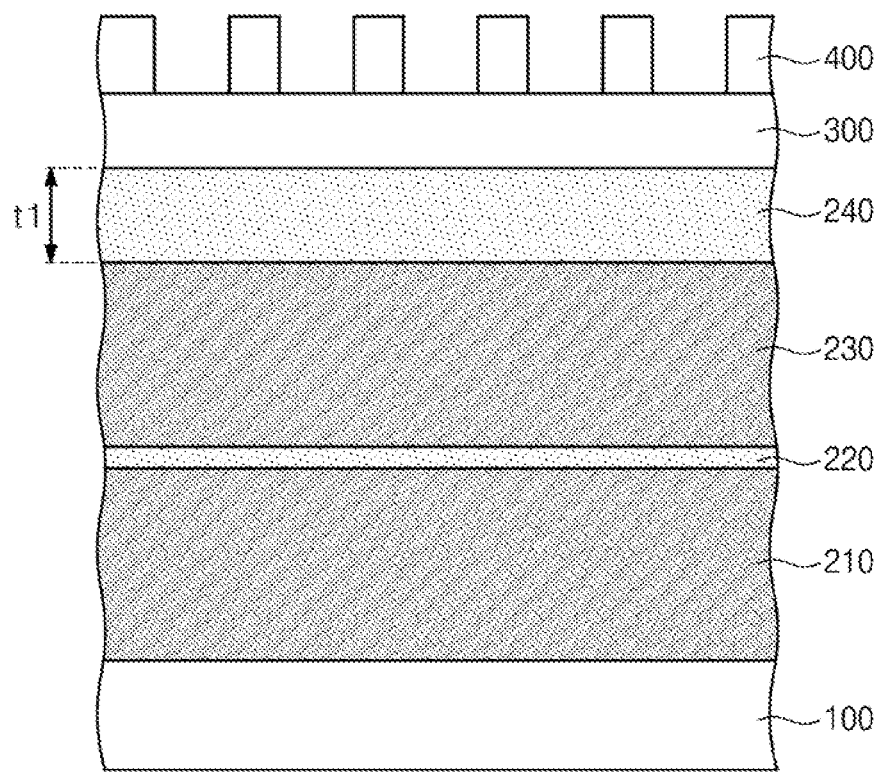
FIGS. 1 to 11 are cross-sectional views illustrating a method for manufacturing a semiconductor device, according to an exemplary embodiment of the present inventive concept.

Referring to FIG. 1, a substrate structure 100 may be provided. The substrate structure 100 may include a semiconductor material (e.g., silicon (Si), germanium (Ge), or a combination thereof), a conductive material (doped polysilicon, a metal silicide, a metal, a metal nitride, or any combination thereof), an insulating material (e.g., a high-density plasma (HDP) oxide, tetraethylorthosilicate (TEOS), plasma enhanced tetraethylorthosilicate (PETEOS), $O_3$-tetraethylorthosilicate ($O_3$-TEOS), undoped silicate glass (USG), phosphosilicate glass (PSG), borosilicate glass (BSG), borophosphosilicate glass (BPSG), fluoride silicate glass (FSG), spin on glass (SOG), Tonen silazene (TOSZ), or any combination thereof), or any combination thereof. The substrate structure 100 may have a single layer or a multi-layer structure including a plurality of stacked layers.

A first sacrificial layer 210, a first supporter layer 220, a second sacrificial layer 230, a second supporter layer 240, a mask layer 300 and a fine pattern 400 may be sequentially formed on the substrate structure 100. The first sacrificial layer 210, the first supporter layer 220, the second sacrificial layer 230, the second supporter layer 240 and the mask layer 300 may be formed using a chemical vapor deposition (CVD) process, a physical vapor deposition (PVD) process, or an atomic layer deposition (ALD) process.

The fine pattern 400 may be formed by a self-alignment double patterning process. For example, the formation of the fine pattern 400 may include forming a photoresist pattern on the mask layer 300, forming a thin layer on the mask layer 300 and the photoresist pattern, anisotropically etching the thin layer by an etch back process to form the fine pattern 400 on a sidewall of the photoresist pattern, and removing the photoresist pattern. For example, the thin layer may be formed using a CVD process, a PVD process, or an ALD process. The fine pattern 400 may have a single-layered structure or a multi-layered structure including a plurality of stacked layers. For example, the fine pattern 400 may include silicon (Si), silicon oxide (e.g., $SiO_2$), or silicon oxynitride (e.g., SiON).

The mask layer 300 may include a material having a relatively high etch selectivity with respect to the fine pattern 400. The mask layer 300 may include a layer including carbon. As an example, carbon may be the primary constituent of the mask layer 300. For example, a carbon content of the mask layer 300 may range from about 70% to about 99%. The mask layer 300 may be a single layer. For example, the mask layer 300 may be an amorphous carbon layer (ACL) or a spin-on-hardmask (SOH) layer.

The second supporter layer 240 may include a material having a relatively high etch selectivity with respect to the mask layer 300. For example, the second supporter layer 240 may include silicon (Si), silicon oxide (e.g., $SiO_2$), a metal oxide (e.g., $WO_x$, $TiO_x$, or $AlO_x$), or silicon oxynitride (e.g., SiON). The second supporter layer 240 may be a single layer. The second supporter layer 240 may have a first thickness t1. The first thickness t1 may be measured along a direction orthogonal to an upper surface of the substrate structure 100.

Each of the first and second sacrificial layers 210 and 230 may include a carbon layer doped with impurities. For example, the carbon layer may be an amorphous carbon layer (ACL) or a spin-on-hardmask (SOH) layer.

The impurities may include a non-metal element except carbon, a metal element, or a combination thereof. For example, the impurities may include boron (B), tungsten (W), barium chloride ($BaCl_2$), tungsten carbide (WC), titanium carbide (TiC), aluminum carbide (AlC), or any combination thereof. For example, the carbon layer may be doped with the impurities in-situ during a process of depositing the carbon layer. The first and second sacrificial layers 210 and 230 may have a relatively high etch selectivity with respect to the second supporter layer 240. For example, a ratio of an etch rate of each of the first and second sacrificial layers 210 and 230 to an etch rate of the second supporter layer 240 may be about 10 or more:1. Adhesive strength of the first and second sacrificial layers 210 and 230 to a conductive material may be increased by the impurities. A concentration of the impurities may be determined to allow the first and second sacrificial layers 210 and 230 to have desired adhesive characteristics and etch characteristics. For example, the concentration of the impurities may range from about 20 vol % to about 80 vol % in each of the first and second sacrificial layers 210 and 230. The concentration of the impurities may refer to a ratio of a total volume of the impurities to a volume of each of the first and second sacrificial layers 210 and 230. If the concentration of the impurities is excessively low (e.g., is lower than about 20 vol %), the adhesive strength of the sacrificial layers 210 and 230 to a conductive material may be lower than a desired degree. If the concentration of the impurities is excessively high (e.g., is higher than about 80 vol %), etch resistance of the first and second sacrificial layers 210 and 230 may be increased, and thus it may be difficult to etch the first and second sacrificial layers 210 and 230. The first and second sacrificial layers 210 and 230 might not be deteriorated at a temperature at which a process of forming a lower conductive layer 610 (described in more detail below) is performed. For example, the process of forming the lower conductive layer 610 may be performed at a temperature of from about 350° C. to about 400° C., and the first and second sacrificial layers 210 and 230 may have heat resistance capable of withstanding at least 400° C.

The first supporter layer 220 may include a same material as the second supporter layer 240. For example, the first supporter layer 220 may include silicon (Si), silicon oxide (e.g., $SiO_2$), a metal oxide (e.g., $WO_x$, $TiO_x$, or $AlO_x$), or silicon oxynitride (e.g., SiON).

Figure 2:
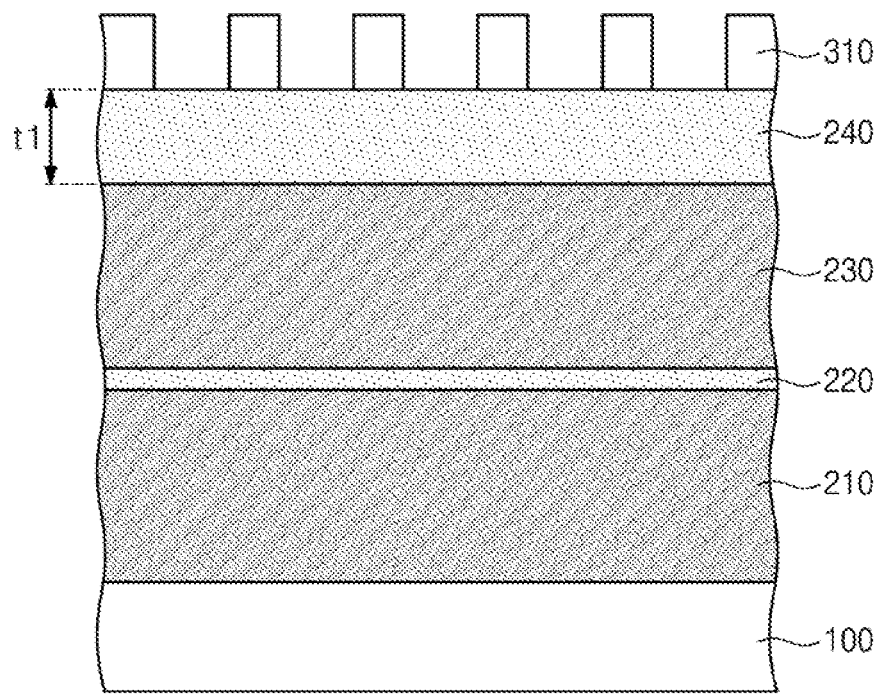

Referring to FIG. 2, a mask pattern 310 may be formed by patterning the mask layer 300. The formation of the mask pattern 310 may include performing an anisotropic etching process using the fine pattern 400 as an etch mask to pattern the mask layer 300. For example, the anisotropic etching process may include an oxygen plasma etching process. In an exemplary embodiment of the present inventive concept, the fine pattern 400 may be removed during the formation of the mask pattern 310. The mask pattern 310 may be in direct contact with an upper surface of the second support layer 240 facing away from the substrate structure 100.

Figure 3:
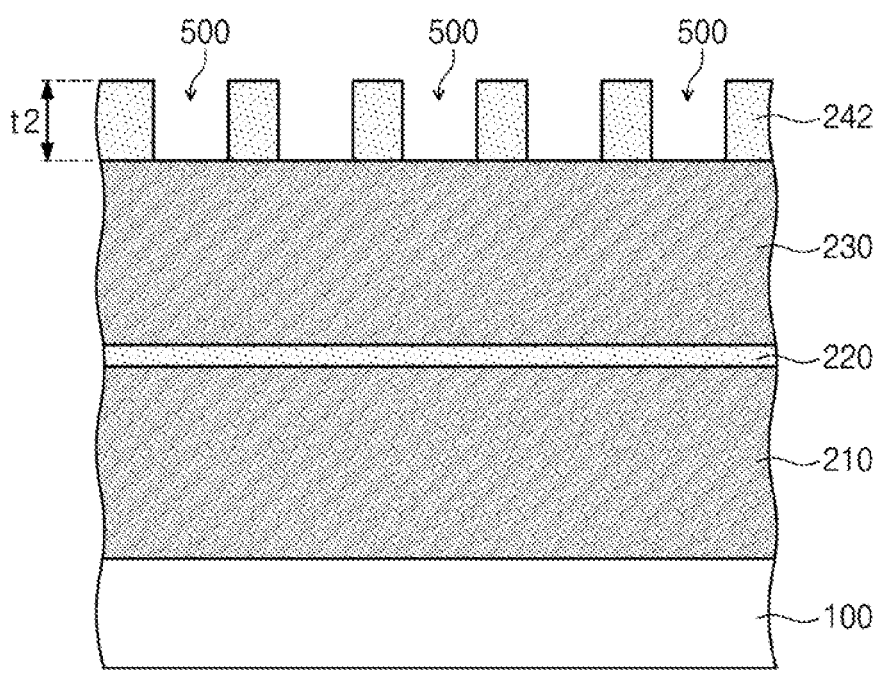

Referring to FIG. 3, a second supporter pattern 242 may be formed by patterning the second supporter layer 240. The formation of the second supporter pattern 242 may include performing an isotropic etching process using the mask pattern 310 as an etch mask to pattern the second supporter layer 240. The anisotropic etching process may include a dry plasma etching process using a mixed gas of a fluorine-based etching gas and an $O_2$ gas or a mixed gas of the fluorine-based etching gas, the $O_2$ gas and an Ar gas. For example, the fluorine-based etching gas may be a $C_3F_6$ gas, a $C_4F_6$ gas, a $C_4F_8$ gas, or a $C_5F_8$ gas. In an exemplary embodiment of the present inventive concept, the mask pattern 310 may be removed during the formation of the second supporter pattern 242. Alternatively, the mask pattern 310 may be removed after the formation of the second support pattern 242. The second supporter pattern 242 may have a second thickness t2 that is equal to or less than the first thickness t1. The second thickness t2 may be measured along the direction orthogonal to the upper surface of the substrate structure 100. Recess regions 500 may be formed in the second supporter pattern 242. For example, the recess regions 500 may be formed by the anisotropic etching process.

Figure 4:
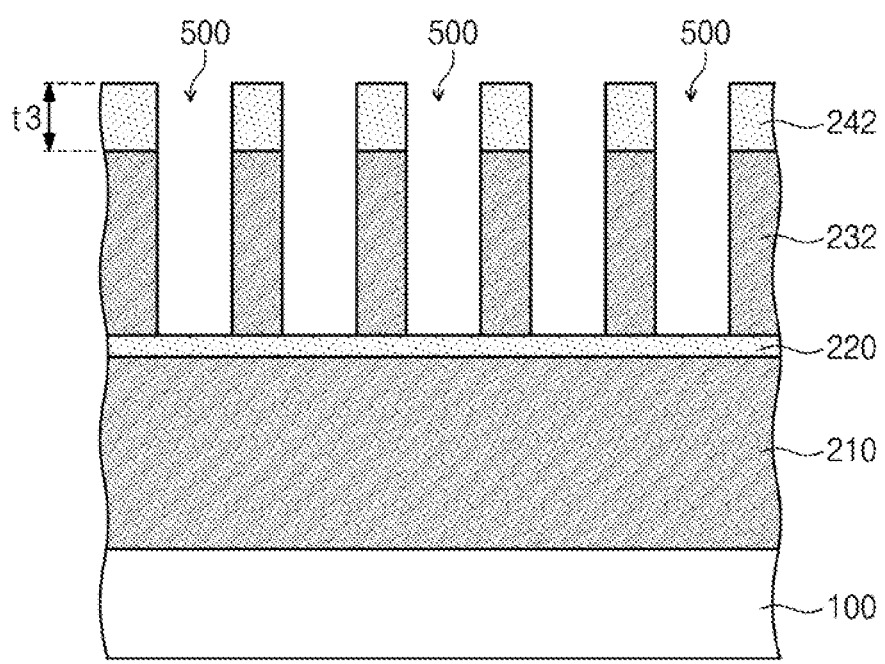

Referring to FIG. 4, a second sacrificial pattern 232 may be formed by patterning the second sacrificial layer 230. The formation of the second sacrificial pattern 232 may include performing a first anisotropic etching process using the second supporter pattern 242 as an etch mask to etch the second sacrificial layer 230. The first anisotropic etching process may include a dry plasma etching process using an etching gas including a $Cl_2$ gas. When the second sacrificial layer 230 is the carbon layer (e.g., the amorphous carbon layer (ACL)) doped with boron, the second sacrificial pattern 232 may be formed by a dry plasma etching process using an etching gas including an $O_2$ gas, the $Cl_2$ gas, a HBr gas, and a carbon oxysulfide (COS) gas. The first anisotropic etching process may be performed at a temperature of about 80° C. or more. Thus, an etch rate of the second sacrificial layer 230 may be increased.

The second supporter pattern 242 might not be completely. Thus a portion of the second support pattern 242 may remain after the first anisotropic etching process using the second supporter pattern 242 as the etch mask is completed (see, e.g., FIG. 5). For example, the thickness of the second supporter pattern 242 may be reduced by the first anisotropic etching process. As an example, the second supporter pattern 242 may have a third thickness t3 less than the second thickness t2 after the first anisotropic etching process. The third thickness t3 may be measured along the direction orthogonal to the upper surface of the substrate structure 100. The recess regions 500 may further extend into the second sacrificial pattern 232 by the first anisotropic etching process.

Figure 5:
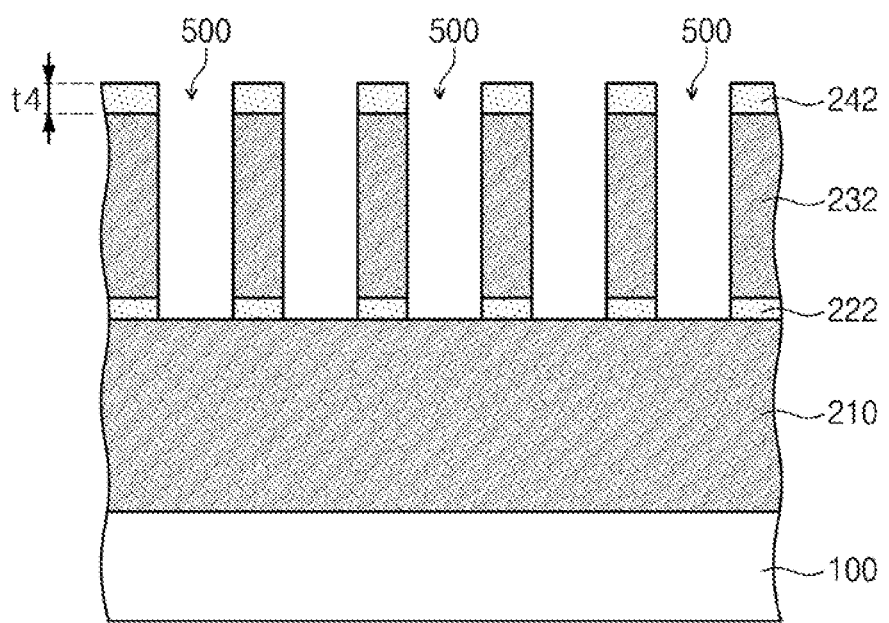

Referring to FIG. 5, a first supporter pattern 222 may be formed by patterning the first supporter layer 220. The first supporter pattern 222 may be in direct contact with an upper surface of the substrate structure 100. The formation of the first supporter pattern 222 may include performing a second anisotropic etching process using the second supporter pattern 242 as an etch mask to etch the first supporter layer 220. The second anisotropic etching process may include a dry plasma etching process using a mixed gas of a fluorine-based etching gas and an $O_2$ gas or a mixed gas of the fluorine-based etching gas, the $O_2$ gas and an Ar gas. For example, the fluorine-based etching gas may be a $C_3F_6$ gas, a $C_4F_6$ gas, a $C_4F_8$ gas, or a C5F8 gas.

The second supporter pattern 242 might not be completely removed. Thus, a portion of the second supporter pattern 242 may remain after the second anisotropic etching process using the second supporter pattern 242 as the etch mask is completed. The thickness of the second supporter pattern 242 may further be reduced by the second anisotropic etching process. As an example, the second supporter pattern 242 may have a fourth thickness t4 less than the third thickness t3 after the second anisotropic etching process. The third thickness t4 may be measured along the direction orthogonal to the upper surface of the substrate structure 100. The recess regions 500 may further extend into the first supporter pattern 222 (e.g., after the second anisotropic etching process). Thus, the recess regions 500 may extend to an upper surface of the first sacrificial layer 210 after the second anoisotropic etching process.

Figure 6:
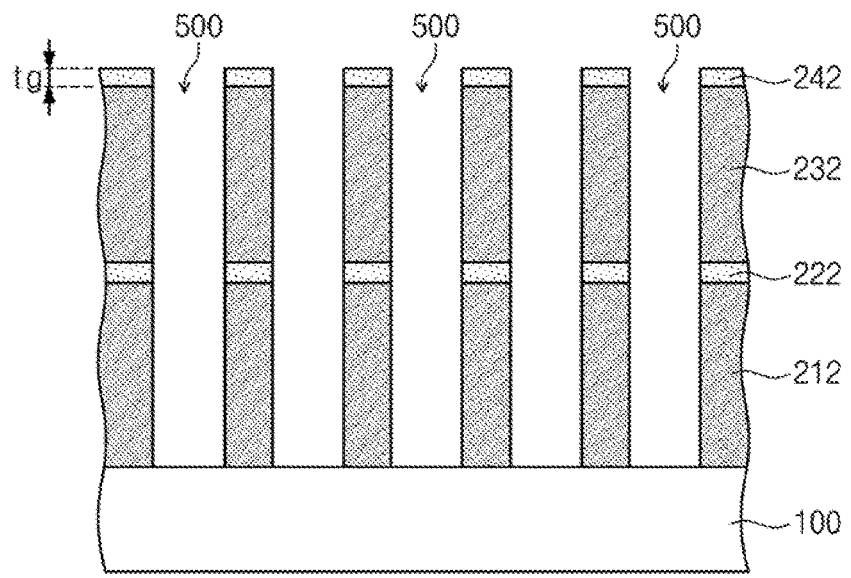

Referring to FIG. 6, a first sacrificial pattern 212 may be formed by patterning the first sacrificial layer 210. The formation of the first sacrificial pattern 212 may include performing a third anisotropic etching process using the second supporter pattern 242 as an etch mask to etch the first sacrificial layer 210. The third anisotropic etching process may include a dry plasma etching process using an etching gas including a $Cl_2$ gas. When the first sacrificial layer 210 is the carbon layer (e.g., the amorphous carbon layer (ACL)) doped with boron, the first sacrificial pattern 212 may be formed by a dry plasma etching process using an etching gas including an $O_2$ gas, the $Cl_2$ gas, a HBr gas, and a carbon oxysulfide (COS) gas. The third anisotropic etching process may be performed at a temperature of about 80° C. or more. Thus, an etch rate of the first sacrificial layer 210 may be increased.

The second supporter pattern 242 might not be completely removed. Thus, a portion of the second supporter pattern 242 may remain after the third anisotropic etching process using the second supporter pattern 242 as the etch mask is completed. Thus, the second supporter pattern 242 may remain (e.g., after the third anisotropic etching process) and the remaining portion of the second supporter pattern 242 might not be removed. The remaining portion of the second supporter pattern 242 may be used as a supporter supporting a capacitor structure, which is described in more detail below. The thickness of the second supporter pattern 242 may further be reduced by the third anisotropic etching process. As an example, the second supporter pattern 242 may have a final thickness tg less than the fourth thickness t4 after the third anisotropic etching process. The final thickness tg may be measured along the direction orthogonal to the upper surface of the substrate structure 100. The final thickness tg may be greater than the minimum thickness to allow the second supporter pattern 242 to function as the supporter. The recess regions 500 may further extend into the first sacrificial pattern 212 by the third anisotropic etching process. Thus, the recess regions 500 may extend to the upper surface of the substrate structure after the third anisotropic etching process.

Figure 7:
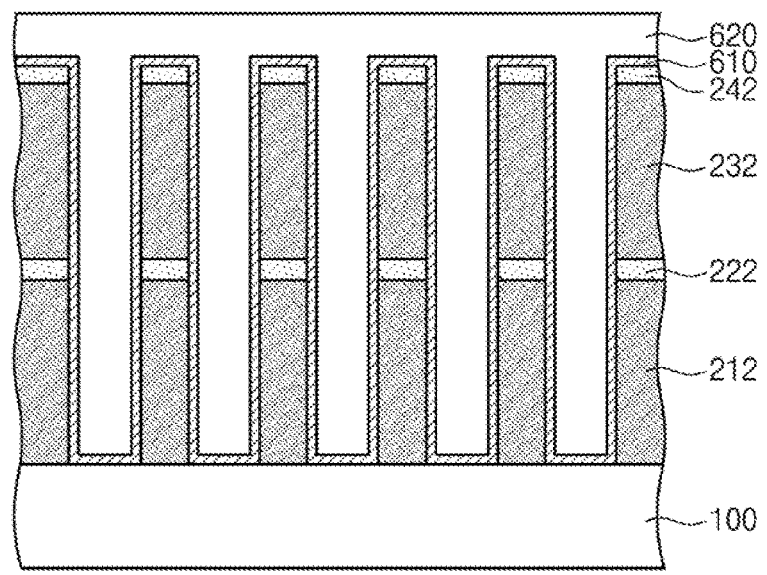

Referring to FIG. 7, a lower conductive layer 610 may be conformally formed on inner surfaces and a bottom surface of the recess regions 500 and a top surface of the second supporter pattern 242. The lower conductive layer 610 may be formed by performing a CVD process, a PVD process, or an ALD process. The process of forming the lower conductive layer 610 may be performed at a temperature of from about 350° C. to about 400° C. The lower conductive layer 610 may include a conductive material. For example, the lower conductive layer 610 may include at least one of a metal material (e.g., titanium, titanium nitride, tantalum, tantalum nitride, or any combination thereof) or doped poly-silicon. In an exemplary embodiment of the present inventive concept, a seed layer may be formed between the lower conductive layer 610 and the inner and bottom surfaces of the recess regions 500.

A third sacrificial layer 620 may be formed on the lower conductive layer 610. The third sacrificial layer 620 may be formed by performing a CVD process, a PVD process, or an ALD process. The third sacrificial layer 620 may fill the recess regions 500 and may cover the top surface of the second supporter pattern 242. The third sacrificial layer 620 may include a same material as the first and second sacrificial patterns 212 and 232. For example, the third sacrificial layer 620 may include a carbon layer doped with the impurities, as described above in more detail.

Figure 8:
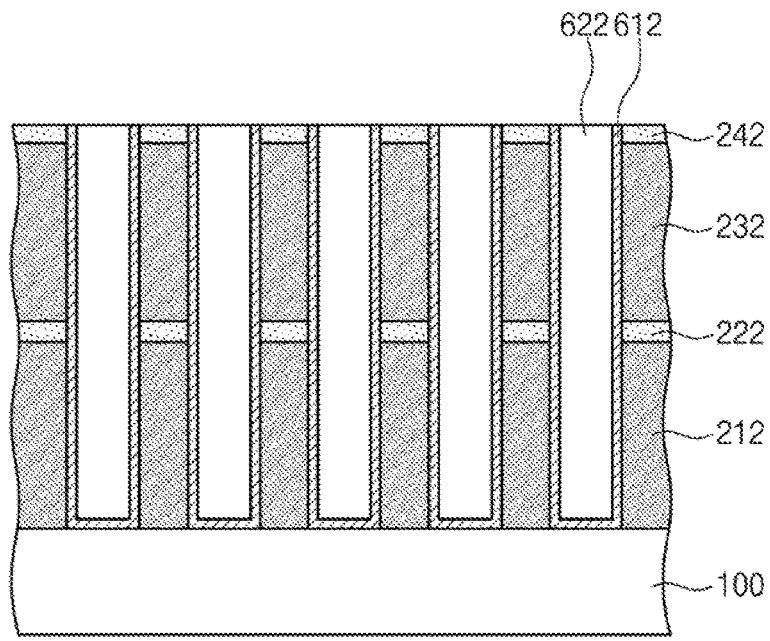

Referring to FIG. 8, a planarization process (e.g., an etch back process) may be performed on the third sacrificial layer 620 and the lower conductive layer 610 to form third sacrificial patterns 622 and lower conductive patterns 612. The planarization process may be performed until the top surface of the second supporter pattern 242 is exposed. Thus, the lower conductive patterns 612 may be formed in the recess regions 500, respectively. The lower conductive patterns 612 may be electrically insulated from each other. Each of the lower conductive patterns 612 may correspond to one of a pair of electrodes included in a capacitor. An upper surface of each of the third sacrificial patterns 622 and upper surfaces of each of the lower conductive patterns 612 may be substantially aligned with each other (e.g., may be coplanar) along a direction parallel to an upper surface of the substrate structure 100.

Figure 9:
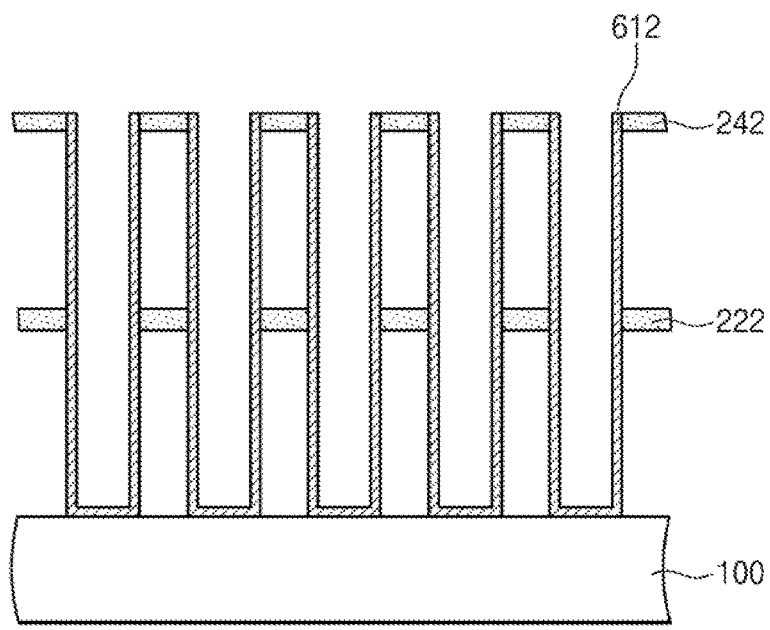

Referring to FIG. 9, the first sacrificial pattern 212, the second sacrificial pattern 232 and the third sacrificial patterns 622 may be removed. The first sacrificial pattern 212, the second sacrificial pattern 232 and the third sacrificial patterns 622 may be removed by an ashing process using oxygen ($O_2$) plasma and/or a strip process. The lower conductive patterns 612 may be supported by the first supporter pattern 222 and the second supporter pattern 242.

Figure 10:
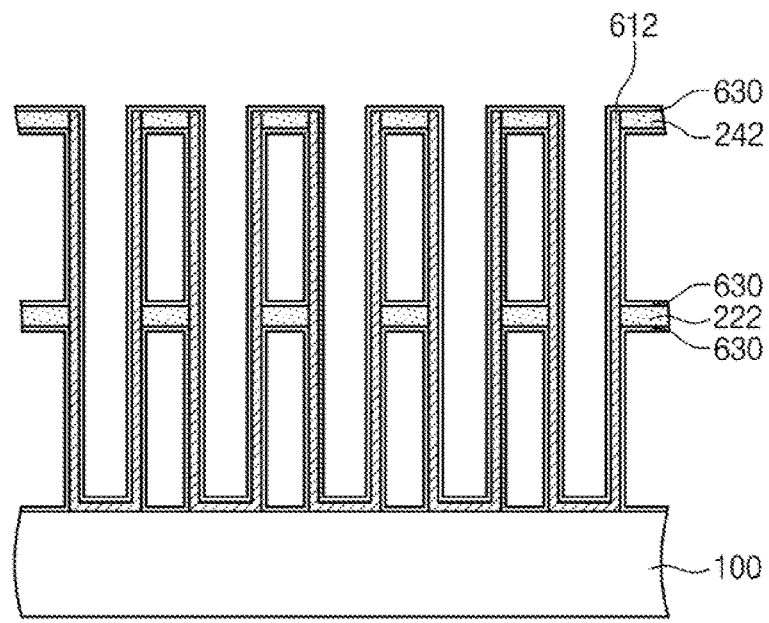

Referring to FIG. 10, a dielectric layer 630 may be formed on surfaces (e.g., top and bottom surfaces) of the second supporter pattern 242, surfaces (e.g., top and bottom surfaces) of the first supporter pattern 222, the lower conductive patterns 612 (e.g., top and side surfaces of the lower conductive patterns 612) and the substrate structure 100 (e.g., a portion of the top surface of the substrate structure 100). The dielectric layer 630 may be formed by performing a CVD process, a PVD process, or an ALD process. The dielectric layer 630 may include a metal oxide having a high dielectric constant. For example, the dielectric layer 630 may include zirconium oxide, zirconium oxynitride, aluminum oxide, tantalum oxide, hafnium oxide, or any combination thereof. The dielectric layer 630 may have a single layer or a multi-layer structure including a plurality of stacked layers. For example, the dielectric layer 630 may include a zirconium oxide layer, an aluminum oxide layer and a zirconium oxide layer which are sequentially stacked, or the dielectric layer 630 may include a zirconium oxide layer, an aluminum oxide layer and a tantalum oxide layer which are sequentially stacked. The dielectric layer 630 may be a dielectric layer that is disposed between the pair of electrodes in the capacitor structure, which is described in more detail below.

Figure 11:
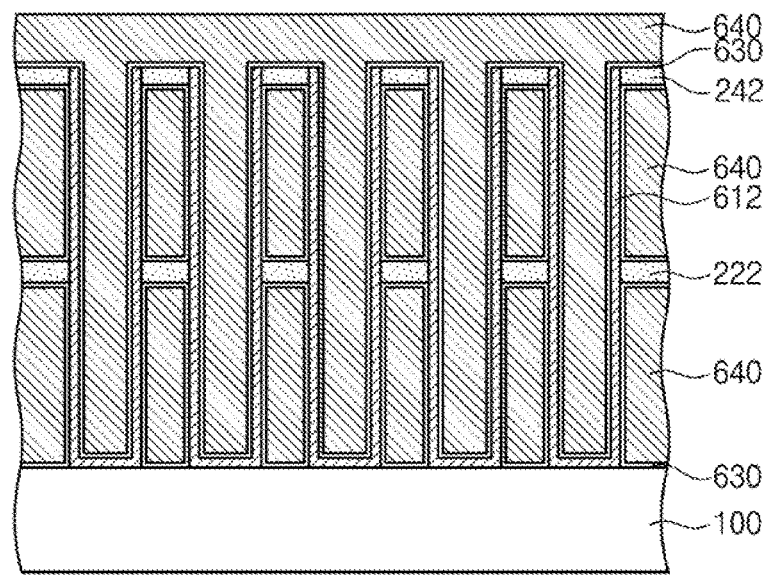

Referring to FIG. 11, an upper conductive layer 640 may be formed on the substrate structure 100. The upper conductive layer 640 may be formed by performing a CVD process, a PVD process, or an ALD process. For example, the upper conductive layer 640 may include at least one of a metal material (e.g., titanium, titanium nitride, tantalum, tantalum nitride, or any combination thereof) or doped poly-silicon. The upper conductive layer 640 may correspond to the other of the pair of electrodes of the capacitor. Thus, a capacitor structure according to an exemplary embodiment of the present inventive concept may include a first electrode (e.g., the lower conductive pattern 612) and a second electrode (e.g., the upper conductive layer 640), which may be spaced apart from each other by a dielectric layer (e.g., the dielectric layer 630). Alternatively, the capacitor structure according to an exemplary embodiment of the present inventive concept may include two electrodes 612 spaced apart from each other by the dielectric layer 630.

Generally, a sacrificial layer (or a mold layer) and at least three mask layers sequentially stacked on the sacrificial layer may be used to form a capacitor having a relatively high aspect ratio on a substrate structure. However, according to an exemplary embodiment of the present inventive concept, since the first and second sacrificial layers 210 and 230 have a relatively high etch selectivity with respect to the second supporter pattern 242 (e.g., the etch rate ratio of 10 or more:1), the number of mask layers can be reduced.

As an example, the second supporter patterns 242 may be used as the etch masks in the processes of etching the first sacrificial layer 210, the second sacrificial layer 230 and the first supporter layer 220. In this case, at least a portion of the second supporter pattern 242 may remain on the second sacrificial pattern 232 due to the etch rate difference described above after the etching processes are completed. The remaining portion of the second supporter pattern 242 may function as the supporter. Thus, the second supporter pattern 242 may be used as both the supporter and the etch masks of the first and second sacrificial layers 210 and 230. Thus, it is possible to reduce or minimize the number of mask layers used to pattern the first sacrificial layer 210, the first supporter layer 220 and the second sacrificial layer 230.

The carbon layer doped with the impurities may have relatively strong adhesive strength with respect to a conductive material, as compared with a pure carbon layer. The first and second sacrificial patterns 212 and 232 according to an exemplary embodiment of the present inventive concept may include the carbon layer doped with the impurities. Thus, the lower conductive layer 610 formed on the first and second sacrificial patterns 212 and 232 may be structurally stable. For example, the lower conductive layer 610 might not be separated from the first and second sacrificial patterns 212 and 232.

The first and second supporter patterns 222 and 242 according to an exemplary embodiment of the present inventive concept may include a material (e.g., silicon (Si), silicon oxide ($SiO_2$), a metal oxide (e.g., $WO_x$, $TiO_x$, or $AlO_x$), or silicon oxynitride (e.g., SiON)) which has a dielectric constant lower than that of $Si_3N_4$. In this case, even though the first and second supporter patterns 222 and 242 between adjacent lower conductive patterns 612 have widths smaller than that of a supporter pattern including $Si_3N_4$, an electrical short between the adjacent lower conductive patterns 612 might not occur. Thus, a distance between the adjacent lower conductive patterns 612 may be reduced or minimized. As a result, surface areas of the lower conductive patterns 612 may be increased to realize capacitor structures having relatively high capacitances.

According to another exemplary embodiment of the present inventive concept, a method for manufacturing a semiconductor device may include forming the first sacrificial layer 210, a first supporter layer 220, the second sacrificial layer 230 and a plurality of second supporter patterns 242 above the substrate 100. The method may include etching the first sacrificial layer 210, the first supporter layer 220 and the second sacrificial layer 230 by using the plurality of second supporter patterns 242 as a mask to form a plurality of first sacrificial patterns 212, a plurality of first supporter patterns 222 and a plurality of second sacrificial patterns 232. A thickness of each of the second supporter patterns 242 may be reduced by the etching. The etching may form a plurality of recess regions 500 between the plurality of first sacrificial patterns 212, the plurality of first supporter patterns 222, the plurality of second sacrificial patterns 232 and the plurality of second supporter patterns 242. The method may include forming a capacitor in each of the recess regions of the plurality of recess regions 500. The capacitor may include the first conductive pattern 612, the dielectric pattern 630 on the first conductive pattern 612 and the second conductive pattern 640 on the dielectric pattern 630.

At least two second supporter patterns of the plurality of second supporter patterns 242 may be positioned to support the capacitor formed in each of the recess regions 500. The method may include removing the plurality of first sacrificial patterns 212 and the plurality of second sacrificial patterns 232.

Figure 12:
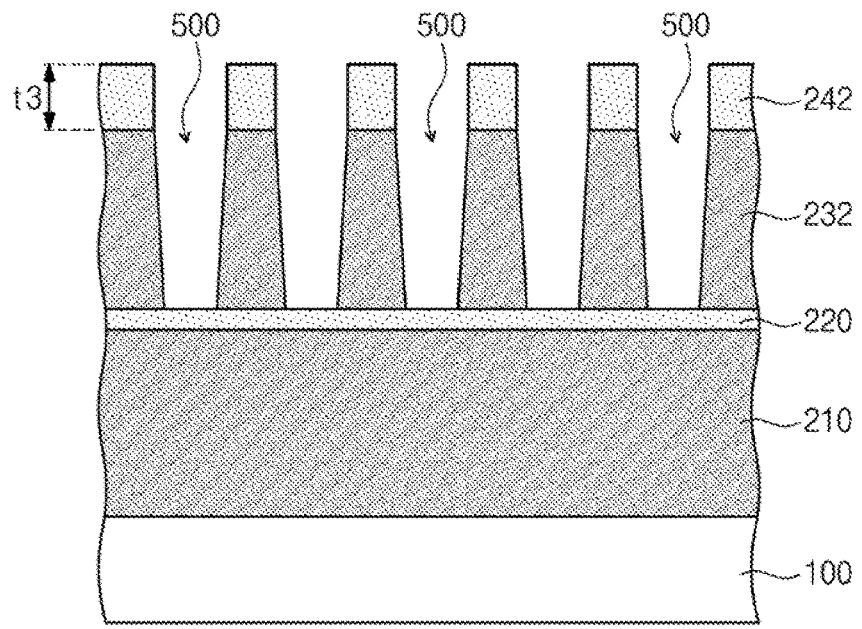
FIGS. 12 and 13 are cross-sectional views illustrating a method for manufacturing a semiconductor device, according to an exemplary embodiment of the present inventive concept.
Figure 13:
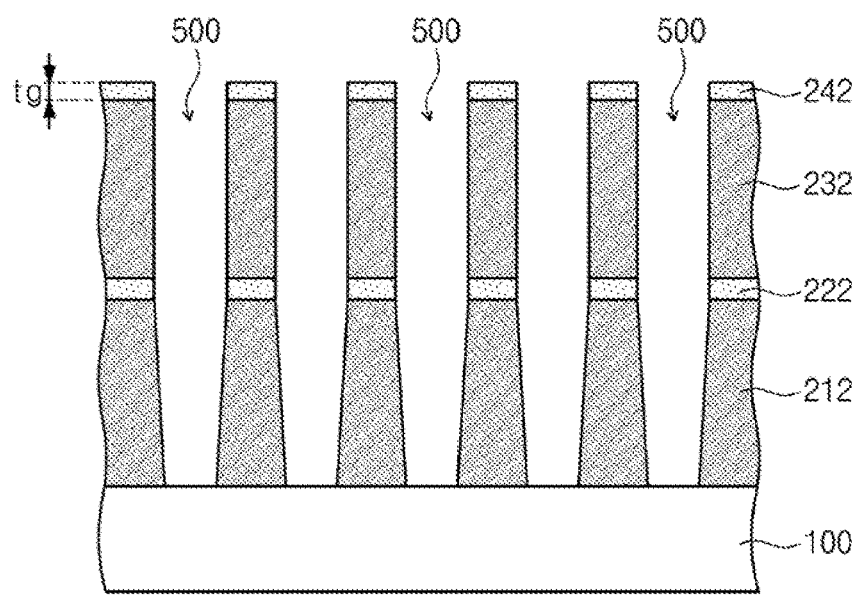

FIGS. 12 and 13 are cross-sectional views illustrating a method for manufacturing a semiconductor device, according to an exemplary embodiment of the present inventive concept. In an exemplary embodiment of the present inventive concept described below with reference to FIGS. 12 and 13, the descriptions of the same or substantially the same components and technical features as those described above with reference to FIGS. 1 to 11 may be omitted or mentioned briefly.

Referring to FIG. 12, substantially the same processes as described with reference to FIGS. 1 to 4 may be performed to form the second supporter pattern 242, the second sacrificial pattern 232, and the recess regions 500. However, each of the recess regions 500 may become progressively narrower toward the first supporter layer 220. Each of the recess regions 500 may have a maximum width at substantially the same height as a top surface of the second sacrificial pattern 232 and may have a minimum width at the same height as a bottom surface of the second sacrificial pattern 232.

The second sacrificial pattern 232 may include the carbon layer doped with the impurities. For example, the carbon layer may be an amorphous carbon layer (ACL) or a spin-on-hardmask (SOH) layer. The impurities may be substantially uniformly distributed in the second sacrificial pattern 232 or may have a concentration gradient in the second sacrificial pattern 232. For example, the concentration of the impurities may become progressively lower toward the first supporter layer 220 in the second sacrificial pattern 232. Alternatively, the concentration of the impurities may become progressively higher toward the first supporter layer 220 in the second sacrificial pattern 232.

Referring to FIGS. 12 and 4, a cleaning process may be performed to remove etch byproducts remaining in the recess regions 500 in the process of forming the second sacrificial pattern 232. A portion of the second sacrificial pattern 232 may also be removed in the cleaning process, and thus each of the recess regions 500 may be laterally enlarged (e.g., along the direction parallel to the upper surface of the substrate structure 100). As a result, each of the recess regions 500 may have a substantially uniform width.

When the concentration of the impurities becomes progressively lower toward the first supporter layer 220 in the second sacrificial pattern 232, the cleaning process may use a cleaning solution or cleaning gas which has a relatively high etch rate with respect to a portion of which the concentration of the impurities is relatively low. Alternatively, when the concentration of the impurities becomes progressively higher toward the first supporter layer 220 in the second sacrificial pattern 232, the cleaning process may use a cleaning solution or cleaning gas which has a relatively high etch rate with respect to a portion of which the concentration of the impurities is relatively high.

Referring to FIG. 13, substantially the same processes as described with reference to FIGS. 5 and 6 may be performed to form the first supporter pattern 222 and the first sacrificial pattern 212. Thus, the recess regions 500 may be vertically extended and the recess regions 500 may reach the upper surface of the substrate structure 100. However, each of the recess regions 500 may become progressively narrower toward the substrate structure 100. Each of the recess regions 500 may have a maximum width at the same height as a top surface of the first sacrificial pattern 212 and may have a minimum width at the same height as a bottom surface of the first sacrificial pattern 212. For example, each of the recess regions 500 may have a substantially uniform width between the second support patterns 242, the second sacrificial patterns 232 and the first support patterns 222, but may become progressively narrower between the first sacrificial patterns 212 as the recess regions 500 approach the upper surface of the substrate structure 100.

The first sacrificial pattern 212 may include the carbon layer doped with the impurities. For example, the carbon layer may be an amorphous carbon layer (ACL) or a spin-on-hardmask (SOH) layer. The impurities may be substantially uniformly distributed in the first sacrificial pattern 212 or may have a concentration gradient in the first sacrificial pattern 212. For example, the concentration of the impurities may become progressively lower toward the substrate structure 100 in the first sacrificial pattern 212. Alternatively, the concentration of the impurities may become progressively higher toward the substrate structure 100 in the first sacrificial pattern 212.

Referring to FIGS. 13 and 6, a cleaning process may be performed to remove etch byproducts remaining in the recess regions 500 in the process of forming the first sacrificial pattern 212. A portion of the first sacrificial pattern 212 may also be removed in the cleaning process, and thus each of the recess regions 500 may be laterally enlarged. As a result, each of the recess regions 500 may have a substantially uniform width.

When the concentration of the impurities becomes progressively lower toward the substrate structure 100 in the first sacrificial pattern 212, the cleaning process may use a cleaning solution or cleaning gas which has a relatively high etch rate with respect to a portion of which the concentration of the impurities is relatively low. Alternatively, in the event that the concentration of the impurities becomes progressively higher toward the substrate structure 100 in the first sacrificial pattern 212, the cleaning process may use a cleaning solution or cleaning gas which has a relatively high etch rate with respect to a portion of which the concentration of the impurities is relatively high.

Thereafter, substantially the same processes as described with reference to FIGS. 7 to 11 may be performed to manufacture a semiconductor device.

According to an exemplary embodiment of the present inventive concept, each of the recess regions 500 may be formed to have a substantially uniform width. Surface areas of the lower conductive patterns 612 formed in the recess regions 500 having the substantially uniform widths may be greater than those of lower conductive patterns formed in recess regions becoming progressively narrower toward the substrate structure 100. As a result, capacitor structures having relatively high capacitances may be formed or realized.

Figure 14:
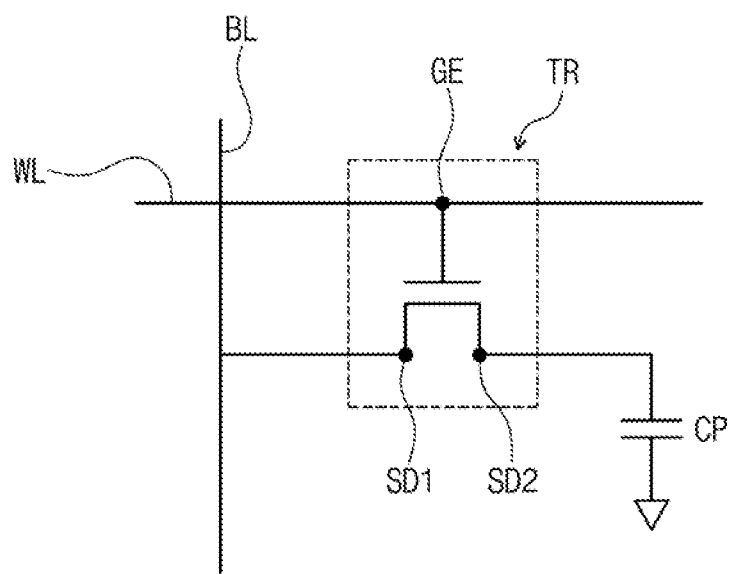
FIG. 14 is a circuit diagram illustrating a dynamic random access memory (DRAM) device.

FIG. 14 is a circuit diagram illustrating a dynamic random access memory (DRAM) device. In an exemplary embodiment of the present inventive concept described below with reference to FIG. 14, the descriptions of the same or substantially the same components and technical features as those described above with reference to FIGS. 1 to 13 may be omitted or mentioned briefly.

Referring to FIG. 14, a DRAM device may include a transistor TR, a capacitor CP, a word line WL, and a bit line BL. The transistor TR, the word line WL and the bit line BL may be included in the substrate structure 100 described with reference to FIGS. 1 to 13. The transistor TR may include a gate terminal GE, a first source/drain terminal SD1, and a second source/drain terminal SD2. The word line WL and the bit line BL may be electrically connected to the gate terminal GE and the first source/drain terminal SD1, respectively.

The capacitor CP may include the lower conductive pattern 612, the dielectric layer 630, and the upper conductive layer 640, which are described in more detail above with reference to FIG. 11. The lower conductive pattern 612 may be electrically connected to the second source/drain terminal SD2. A method for forming the capacitor CP may be substantially the same as described with reference to FIGS. 1 to 11 and/or 12 and 13.

FIGS. 15 to 18 are cross-sectional views illustrating a method for forming a conductive pattern, according to an exemplary embodiment of the present inventive concept. In an exemplary embodiment of the present inventive concept described below with reference to FIGS. 15 to 18, the descriptions to the same or substantially the same components and technical features as those described above with reference to FIGS. 1 to 11 may be omitted or mentioned briefly.

Figure 15:
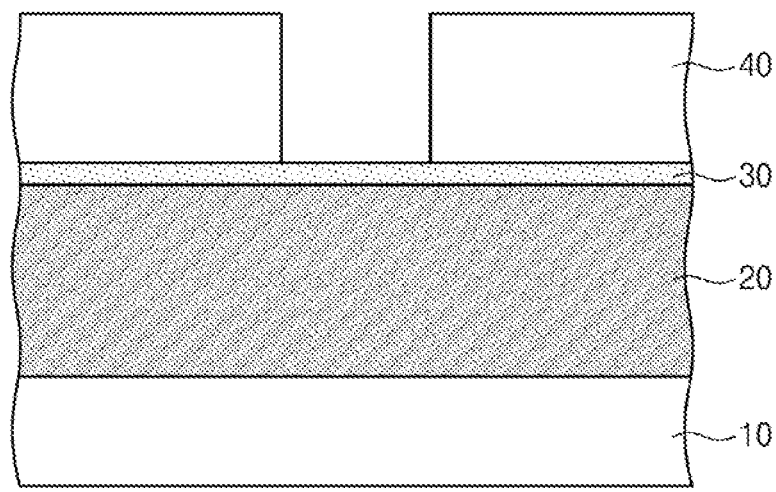
FIGS. 15 to 18 are cross-sectional views illustrating a method for forming a conductive pattern, according to an exemplary embodiment of the present inventive concept.

Referring to FIG. 15, a fourth sacrificial layer 20 and a supporter layer 30 may be sequentially formed on a substrate structure 10. The substrate structure 10, the fourth sacrificial layer 20 and the supporter layer 30 may be substantially the same as the substrate structure 100, the second sacrificial layer 230 and the second supporter layer 240, respectively, described in more detail above with reference to FIG. 1. A photoresist pattern 40 may be formed on the supporter layer 30. The photoresist pattern 40 may expose a portion of a top surface of the supporter layer 30.

Figure 16:
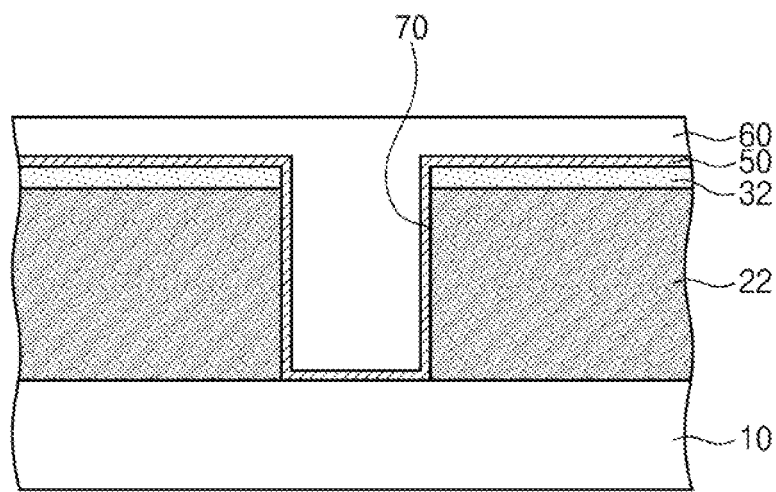

Referring to FIG. 16, the supporter layer 30 and the fourth sacrificial layer 20 may be patterned to form a supporter pattern 32 and a fourth sacrificial pattern 22. The formation of the supporter pattern 32 and the fourth sacrificial pattern 22 may include performing anisotropic etching processes using the photoresist pattern 40 as an etch mask to etch the supporter layer 30 and the fourth sacrificial layer 20. The anisotropic etching processes may be substantially the same as the anisotropic etching processes performed on the second supporter layer 240 and the second sacrificial layer 230, which are described in more detail above with reference to FIGS. 3 and 4. The anisotropic etching process of the fourth sacrificial layer 20 may be performed until a top surface of the substrate structure 10 is exposed. Thus, a recess region 70 exposing the top surface of the substrate structure 10 may be formed in the supporter pattern 32 and the fourth sacrificial pattern 22.

A conductive layer 50 and a fifth sacrificial layer 60 may be sequentially formed on the substrate structure 10, the fourth sacrificial pattern 22, and the supporter pattern 32. The conductive layer 50 and the fifth sacrificial layer 60 may be formed by performing a CVD process, a PVD process, or an ALD process. The conductive layer 50 may extend along an inner surface of the recess region 70 and a top surface of the supporter pattern 32. The fifth sacrificial layer 60 may fill the recess region 70 and may cover the top surface of the supporter pattern 32. The fifth sacrificial layer 60 may include a same material as the fourth sacrificial layer 20.

Figure 17:
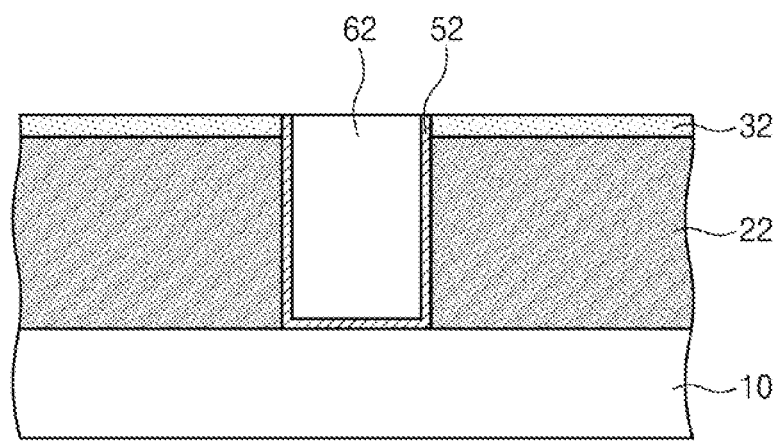

Referring to FIG. 17, the fifth sacrificial layer 60 and the conductive layer 50 may be planarized to form a fifth sacrificial pattern 62 and a conductive pattern 52. The planarization process (e.g., an etch back process) may be performed until the top surface of the supporter pattern 32 is exposed.

Figure 18:
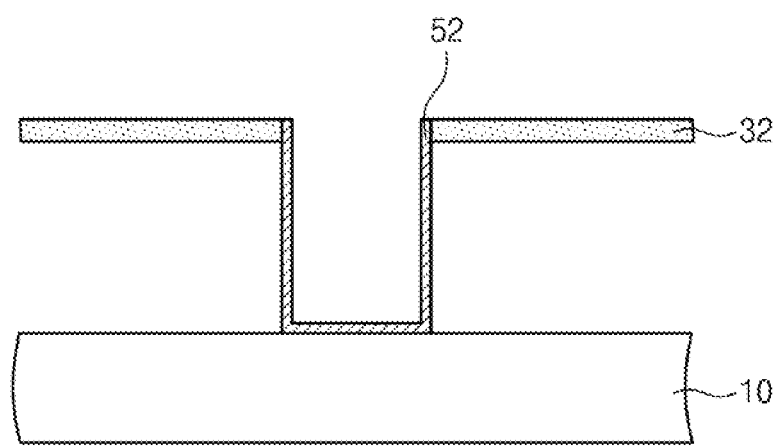

Referring to FIG. 18, the fourth sacrificial pattern 22 and the fifth sacrificial pattern 62 may be removed. For example, the fourth sacrificial pattern 22 and the fifth sacrificial pattern 62 may be removed by an ashing process using oxygen plasma and/or a strip process. Thus, the conductive pattern 52 supported by the supporter pattern 32 may be formed on the substrate structure 10.

According to an exemplary embodiment of the present inventive concept, a semiconductor device with increased reliability may be provided.

According to an exemplary embodiment of the present inventive concept, a method for manufacturing a semiconductor device with increased efficiency may be provided.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A method for manufacturing a semiconductor device, the method comprising:
    providing a substrate structure;
    forming a lower sacrificial layer, a lower supporter layer, an upper sacrificial layer, and an upper supporter layer which are sequentially stacked on the substrate structure;
    forming a mask pattern on the upper supporter layer;
    forming an upper supporter pattern by etching the upper supporter layer using the mask pattern as an etch mask;
    forming a recess region penetrating the upper supporter pattern, the upper sacrificial layer, the lower supporter layer, and the lower sacrificial layer; and
    removing the lower sacrificial layer and the upper sacrificial layer,
    wherein the mask pattern is removed during the process of forming the upper supporter pattern, and
    wherein, when the process of forming the recess region is completed, the upper supporter pattern remains.

2. The method of claim 1, further comprising:
    forming a lower electrode pattern extending along an inner surface of the recess region.

3. The method of claim 2, wherein the forming the lower electrode pattern comprises:
    forming a lower electrode layer extending along an upper surface of the upper supporter pattern and the inner surface of the recess region; and
    removing the lower electrode layer on the upper surface of the upper supporter pattern.

4. The method of claim 2, further comprising:
    forming an upper electrode layer on the lower electrode pattern; and
    forming a dielectric layer between the lower electrode pattern and the upper electrode layer.

5. The method of claim 1, wherein a thickness of the upper supporter pattern is reduced during the process of forming the recess region.

6. The method of claim 1, wherein the forming the recess region comprises sequentially etching the upper sacrificial layer, the lower supporter layer, and the lower sacrificial layer using the upper supporter pattern as an etch mask.

7. The method of claim 6, wherein the forming the recess region further comprises performing a first cleaning process laterally enlarging the recess region in the upper sacrificial layer, and
    wherein the first cleaning process is performed before the process of etching the lower supporter layer.

8. The method of claim 6, wherein the forming the recess region further comprises performing a second cleaning process laterally enlarging the recess region in the lower sacrificial layer, and
wherein the second cleaning process is performed after the process of etching the lower sacrificial layer.

9. A method for manufacturing a semiconductor device, the method comprising:
providing a substrate structure;
forming a sacrificial layer and a supporter layer stacked sequentially on the substrate structure;
forming a mask pattern on the supporter layer;
forming a supporter pattern by etching the supporter layer using the mask pattern as an etch mask;
forming the sacrificial pattern by etching the sacrificial layer using the supporter pattern as an etch mask; and
removing the sacrificial pattern,
wherein the mask pattern is removed during the process of forming the supporter pattern, and
wherein, when the process of forming the sacrificial pattern is completed, the supporter pattern remains.

10. The method of claim 9, wherein the sacrificial layer includes a carbon layer doped with impurities, and
wherein the impurities include an element different from carbon.

11. The method of claim 10, wherein the impurities are uniformly distributed in the sacrificial pattern, and
wherein a concentration of the impurities ranges from 20 vol % to 80 vol % in the sacrificial pattern.

12. The method of claim 10, wherein the impurities include boron (B) or tungsten (W).

13. The method of claim 10, wherein a concentration of the impurities has a gradient in the sacrificial pattern, and
wherein the concentration of the impurities becomes progressively higher toward the substrate structure or becomes progressively lower toward the substrate structure.

14. The method of claim 9, wherein the supporter pattern includes silicon (Si), silicon oxide, a metal oxide, or silicon oxynitride.

15. The method of claim 9, wherein the etching the sacrificial layer is performed by a dry plasma etching process using an etching gas including a $Cl_2$ gas.

16. The method of claim 15, wherein the etching gas further includes an $O_2$ gas, a HBr gas, and a carbon oxysulfide (COS) gas.

17. A method for manufacturing a semiconductor device, the method comprising:
forming a first sacrificial layer, a first supporter layer, a second sacrificial layer and a plurality of second supporter patterns above a substrate;
etching the first sacrificial layer, the first supporter layer and the second sacrificial layer by using the plurality of second supporter patterns as a mask to form a plurality of first sacrificial patterns, a plurality of first supporter patterns and a plurality of second sacrificial patterns, wherein a thickness of each of the second supporter patterns is reduced by the etching, and wherein the etching forms a plurality of recess regions between the plurality of first sacrificial patterns, the plurality of first supporter patterns, the plurality of second sacrificial patterns and the plurality of second supporter patterns;
forming a capacitor in each of the recess regions of the plurality of recess regions, wherein the capacitor includes a first conductive pattern, a dielectric pattern on the first conductive pattern and a second conductive pattern on the dielectric pattern, and wherein at least two second supporter patterns of the plurality of second supporter patterns are positioned to support the capacitor formed in each of the recess regions; and
removing the plurality of first sacrificial patterns and the plurality of second sacrificial patterns.

18. The method of claim 17, wherein the plurality of first sacrificial patterns and the plurality of second sacrificial patterns are removed after forming the first conductive pattern and before forming the dielectric pattern and the second conductive pattern.

19. The method of claim 17, wherein the forming the plurality of the second supporter patterns comprising:
forming a second supporter layer on the second sacrificial layer;
forming a plurality of mask patterns on the second supporter layer; and
etching the second supporter layer using the plurality of mask patterns as an etch mask,
wherein the plurality of the mask patterns are removed during the process of etching the second supporter layer.

20. The method of claim 17, wherein each of the first sacrificial layer and the second sacrificial layer include a carbon layer doped with impurities, and
wherein the impurities include an element different from carbon.

* * * * *